United States Patent
Koguchi et al.

(10) Patent No.: US 9,455,153 B2
(45) Date of Patent: Sep. 27, 2016

(54) PLASMA PROCESSING METHOD

(71) Applicant: Tokyo Electron Limited, Tokyo (JP)

(72) Inventors: Genki Koguchi, Nirasaki (JP); Akio Morisaki, Nirasaki (JP); Yukinori Hanada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 648 days.

(21) Appl. No.: 13/920,303

(22) Filed: Jun. 18, 2013

(65) Prior Publication Data

US 2013/0280915 A1    Oct. 24, 2013

Related U.S. Application Data

(62) Division of application No. 12/749,691, filed on Mar. 30, 2010, now abandoned.

(60) Provisional application No. 61/242,544, filed on Sep. 15, 2009.

(30) Foreign Application Priority Data

Mar. 31, 2009   (JP) ................ 2009-084748

(51) Int. Cl.
H01L 21/3065 (2006.01)
H01J 37/32 (2006.01)

(52) U.S. Cl.
CPC ..... H01L 21/3065 (2013.01); H01J 37/32091 (2013.01); H01J 37/32146 (2013.01); H01J 37/32183 (2013.01)

(58) Field of Classification Search
None
See application file for complete search history.

(56) References Cited

U.S. PATENT DOCUMENTS

| | | | |
|---|---|---|---|
| 8,404,598 B2 * | 3/2013 | Liao ............... | H01J 37/32082 216/68 |
| 2006/0252283 A1 * | 11/2006 | Takeda ............ | H01J 37/32082 438/798 |
| 2008/0110859 A1 | 5/2008 | Koshiishi et al. | |
| 2009/0066438 A1 | 3/2009 | Kim et al. | |
| 2009/0284156 A1 * | 11/2009 | Banna ............. | H01J 37/321 315/111.21 |
| 2010/0248488 A1 * | 9/2010 | Agarwal .......... | H01J 37/32091 438/714 |

FOREIGN PATENT DOCUMENTS

| | | |
|---|---|---|
| JP | 2000-150478 A | 5/2000 |
| JP | 2005-130198 A | 5/2005 |
| JP | 2009-033080 A | 2/2009 |

* cited by examiner

Primary Examiner — Allan Olsen
(74) Attorney, Agent, or Firm — Pearne & Gordon LLP

(57) ABSTRACT

There is provided a plasma processing method capable of carrying out a stable plasma process by way of improving plasma stabilization and also capable of increasing lifetime of a variable capacitor in a matching unit, as compared to a conventional case. The plasma processing method comprises performing a power modulation that periodically switches the high frequency power from the high frequency power supply between a first power and a second power higher than the first power, and performing a mask control that stops a matching operation of the matching unit for an application time of the first power and for a preset time after an application of the second power is started.

8 Claims, 6 Drawing Sheets

SIGNAL FROM RF CONTROLLER

ONE PERIOD OF SECOND HIGH FREQUENCY POWER

PLASMA PROCESSING METHOD

CROSS-REFERENCE TO RELATED APPLICATION

This is a divisional application of U.S. patent application Ser. No. 12/749,691 filed on Mar. 30, 2010, which claims the priority from Japanese Patent Application No. 2009-084748 filed on Mar. 31, 2009 and U.S. Provisional Application Ser. No. 61/242,544 filed on Sep. 15, 2009, the entire disclosures of which are incorporated herein by reference.

FIELD OF THE INVENTION

The present disclosure relates to a plasma processing apparatus and a plasma processing method for performing a plasma process such as an etching process on a substrate.

BACKGROUND OF THE INVENTION

Conventionally, a plasma processing apparatus that performs a plasma process such as an etching process or a film forming process on a semiconductor wafer, an LCD (liquid crystal display) glass substrate or the like has been widely employed in the field of manufacture of, e.g., a semiconductor device.

As one of such plasma processing apparatuses, there is known a capacitively coupled plasma processing apparatus that generates plasma of a processing gas by applying a high frequency power between parallel-plate-type facing electrodes provided within a processing chamber. Further, there is also known a plasma processing apparatus configured to perform a power modulation by way of periodically switching a high frequency power between a first power and a second power higher than the first power (see, for example, Patent Document 1).

Patent Document 1: Japanese Patent Laid-open Publication 2009-33080 (US Patent Publication No. 2008/0110859 A1)

In such a conventional plasma processing apparatus performing the above-described power modulation, a matching operation by a matching unit is not performed when the first power (lower power) is applied, whereas a matching operation by the matching unit is performed only when the second power (higher power) is applied. In such a plasma processing apparatus, however, if the high frequency power is applied in a pulse pattern through the power modulation, plasma state may fluctuate excessively during the rise of the pulse of the high frequency power. Thus, it takes some time until plasma is stabilized. At this time, since the matching unit attempts to perform the matching operation according to the fluctuation of the plasma state, a variable capacitor of the matching unit repeats minute movements, resulting in deterioration of plasma stabilization. As a consequence, plasma processing state would become unstable, and lifetime of the variable capacitor would be shortened.

BRIEF SUMMARY OF THE INVENTION

In view of the foregoing, the present disclosure provides a plasma processing apparatus and a plasma processing method capable of carrying out a stable plasma process by way of improving plasma stabilization and also capable of increasing lifetime of the variable capacitor in the matching unit, as compared to the conventional case.

In accordance with one aspect of the present disclosure, there is provided a plasma processing apparatus including: a processing chamber configured to accommodate a substrate and perform a plasma process thereon; a processing gas supply unit configured to supply a processing gas into the processing chamber; a pair of parallel-plate-type electrodes provided within the processing chamber and including a lower electrode serving as a mounting table configured to mount the substrate thereon and an upper electrode provided above the lower electrode; a high frequency power supply configured to apply a high frequency power to at least one of the pair of electrodes; a matching unit configured to perform impedance matching of the high frequency power from the high frequency power supply, the matching unit being connected to the one of the electrodes; and a control unit configured to perform a power modulation for periodically switching the high frequency power from the high frequency power supply between a first power and a second power higher than the first power and to perform a mask control for stopping a matching operation of the matching unit for a first power application time and for a preset time after a second power application is started.

The high frequency power supply may be a high frequency power supply for attracting ions connected with the lower electrode and configured to output a high frequency power for attracting ions, and the control unit may perform the power modulation of the high frequency power for attracting ions and performs the mask control of the matching unit.

The plasma processing apparatus may further include a high frequency power supply for generating plasma configured to apply a high frequency power for generating plasma to the upper electrode.

The plasma processing apparatus may further include a high frequency power supply for generating plasma configured to apply a high frequency power for generating plasma to the lower electrode.

The plasma processing apparatus may further include a matching unit for the high frequency power supply for generating plasma and the matching unit may be configured to perform impedance matching of the high frequency power for generating plasma. The control unit may stop a matching operation of the matching unit for the high frequency power supply for generating plasma according to the mask control of the matching unit.

The plasma processing apparatus may further include a matching unit for the high frequency power supply for generating plasma and the matching unit may be configured to perform impedance matching of the high frequency power for generating plasma. The control unit may switch the high frequency power for generating plasma between a third power and a fourth power higher than the third power in synchronization with the power modulation, and stop the matching operation of the matching unit for the high frequency power supply for generating plasma according to the mask control.

The high frequency power supply may be a high frequency power supply for generating plasma configured to output a high frequency power for generating plasma, and the control unit may perform the power modulation of the high frequency power for generating plasma and performs the mask control of the matching unit.

The high frequency power supply for generating plasma may be connected with the upper electrode.

The high frequency power supply for generating plasma may be connected with the lower electrode.

The plasma processing apparatus may further include a high frequency power supply for attracting ions configured to apply a high frequency power for attracting ions to the lower electrode; and a matching unit for the high frequency power supply for attracting ions. The matching unit may be configured to perform impedance matching of the high frequency power for attracting ions from the high frequency power supply for attracting ions. The control unit may stop a matching operation of the matching unit for the high frequency power supply for attracting ions according to the mask control of the matching unit.

A plasma etching process may be performed on the substrate.

The control unit may control the high frequency power supply to perform the power modulation after the plasma process is performed on the substrate for a preset time by applying a high frequency power of a certain power level from the high frequency power supply.

In accordance with another aspect of the present disclosure, there is provided a plasma processing method using a plasma processing apparatus that includes a processing chamber configured to accommodate a substrate and perform a plasma process thereon; a processing gas supply unit configured to supply a processing gas into the processing chamber; a pair of parallel-plate-type electrodes provided within the processing chamber; a high frequency power supply configured to apply a high frequency power to at least one of the pair of electrodes; and a matching unit configured to perform impedance matching of the high frequency power from the high frequency power supply, the matching unit being connected to the one of the electrodes. The plasma processing method includes performing a power modulation for periodically switching the high frequency power from the high frequency power supply between a first power and a second power higher than the first power; and performing a mask control for stopping a matching operation of the matching unit for a first power application time and for a preset time after a second power application is started.

A plasma etching process may be performed on the substrate.

The power modulation may be performed after the plasma process is performed on the substrate for a preset time by applying a high frequency power of a certain power level from the high frequency power supply.

In accordance with the present disclosure, it is possible to provide a plasma processing apparatus and a plasma processing method capable of carrying out a stable plasma process by way of improving plasma stabilization and also capable of increasing lifetime of the variable capacitor in the matching unit, as compared to the conventional case.

BRIEF DESCRIPTION OF THE DRAWINGS

The disclosure may best be understood by reference to the following description taken in conjunction with the following figures.

DETAILED DESCRIPTION OF THE INVENTION

Hereinafter, embodiments of the present disclosure will be described with reference to the accompanying drawings.

Figure 1:
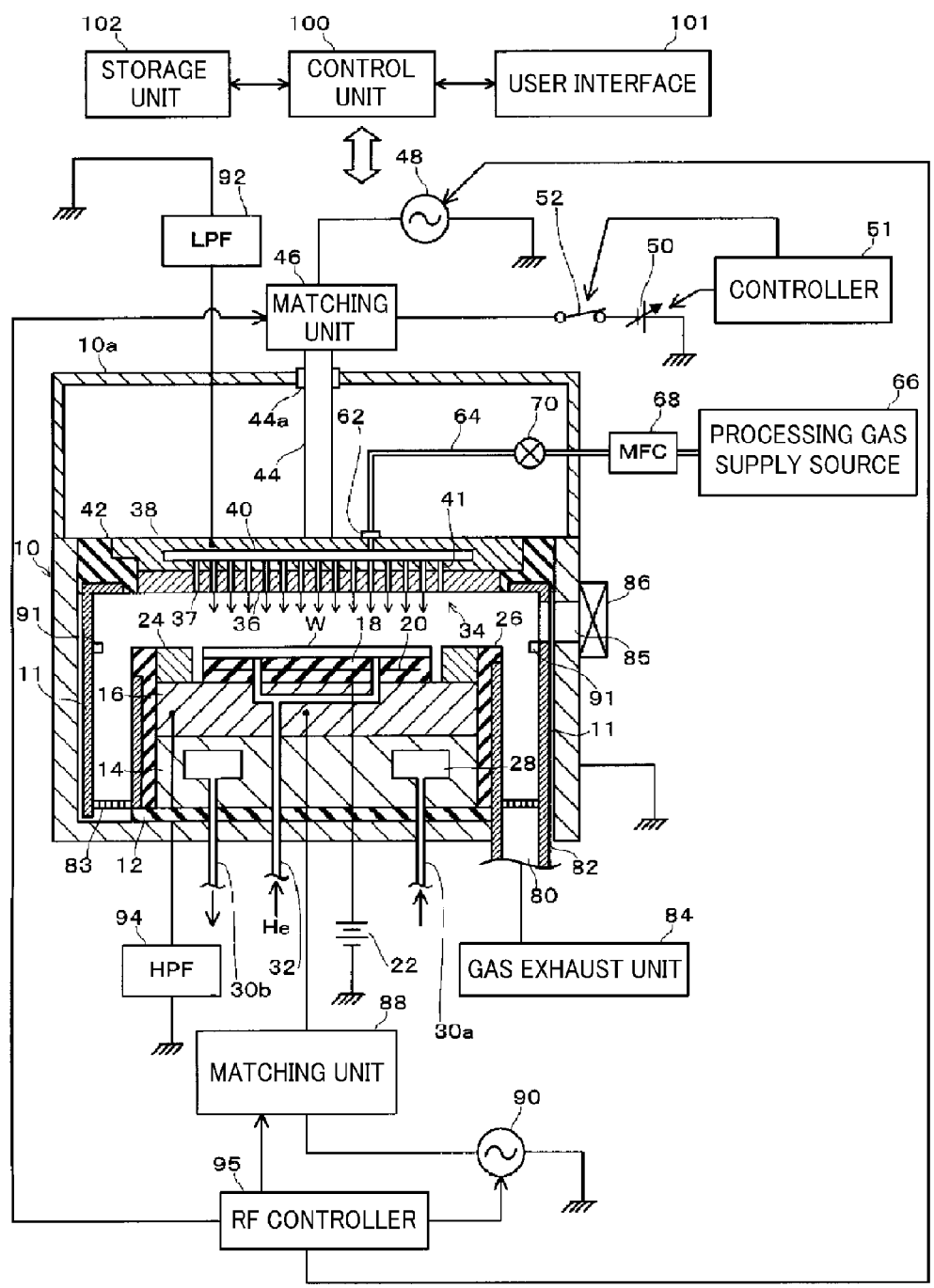
FIG. 1 is a longitudinal cross sectional view showing a configuration of a plasma etching apparatus in accordance with a first embodiment of present disclosure.

FIG. 1 is a configuration view of a plasma etching apparatus in accordance with an embodiment of the present disclosure. This plasma etching apparatus is configured as a capacitively coupled parallel plate type plasma etching apparatus. The plasma etching apparatus includes, as illustrated in FIG. 1, a substantially cylindrical processing chamber 10 made of, e.g., aluminum having an anodically oxidized surface. The chamber 10 is frame-grounded.

A cylindrical susceptor support 14 is installed on a bottom of the processing chamber 10, with an insulating plate 12 made of ceramic therebetween. On the susceptor support 14, a susceptor 16 made of, e.g., aluminum is installed. The susceptor 16 serves as a lower electrode, and a semiconductor wafer W as a target substrate is mounted thereon.

On a top surface of the susceptor 16, an electrostatic chuck 18 for attracting and holding the semiconductor wafer W by an electrostatic force is installed. This electrostatic chuck 18 is configured to have an electrode 20 formed of a conductive film between a pair of insulating layers or insulating sheets and the electrode 20 is electrically connected with a DC power supply 22. The semiconductor wafer W is attracted and held on the electrostatic chuck 18 by an electrostatic force such as a Coulomb force generated by a DC voltage from the DC power supply 22.

A ring-shaped focus ring 24 made of, e.g., a silicon is provided on the top surface of the susceptor 16 around the electrostatic chuck 18 (semiconductor wafer W). At a side surface of the susceptor 16 and the susceptor support 14, a cylindrical inner wall member 26 made of, e.g., quartz is installed.

A coolant portion 28 is provided within the susceptor support 14. A coolant such as cooling water of a predetermined temperature is supplied and circulated from a non-illustrated chiller unit, which is installed outside the plasma etching apparatus, into the coolant portion 28 through coolant lines 30a and 30b. Accordingly, it is possible to control a temperature of the semiconductor wafer W on the susceptor 16 by controlling a temperature of the coolant.

Furthermore, a heat transfer gas such as a He gas is supplied into between a top surface of the electrostatic chuck 18 and a rear surface of the semiconductor wafer W from a non-illustrated heat transfer gas supply unit through a gas supply line 32.

Above the susceptor 16 serving as a lower electrode, an upper electrode 34 is positioned so as to face the susceptor 16 in parallel. A space between the upper electrode 34 and the susceptor (lower electrode) 16 is a plasma generation space. The upper electrode 34 has a surface (facing surface) facing the semiconductor wafer W on the susceptor 16 serving as a lower electrode, and this facing surface is in contact with the plasma generation space.

The upper electrode 34 is supported at the top of the processing chamber 10 by an insulating shield member 42. The upper electrode 34 includes: an electrode plate 36, which is formed as a surface facing the susceptor 16, having a plurality of gas discharge holes 37; and an electrode support 38 for detachably supporting the electrode plate 36. The electrode support 38 is made of a conductive material such as aluminum of which surface is anodically oxidized and has a water-cooling structure. The electrode plate 36 is desirably made of conductor or a semiconductor of a low resistance (low Joule's heat), and it is also desirable to be made of a silicon-containing material in order to reinforce a resist. To be specific, the electrode plate 36 is desirably made of silicon or SiC. The electrode support includes therein a gas diffusion space 40, and a plurality of gas through holes 41 communicated with the gas discharge holes 37 are extended downwardly from the gas diffusion space 40.

On the electrode support 38, there is provided a gas inlet 62 for introducing a processing gas into the gas diffusion space 40, and the gas inlet 62 is connected with a gas supply line 64. The gas supply line 64 is connected with a processing gas supply source 66. Further, there are provided a mass flow controller (MFC) 68 and an opening/closing valve 70 in sequence from an upstream side of the gas supply line 64. A fluorocarbon gas (CxFy), such as $C_4F_8$ gas, as a processing gas for etching is supplied from the processing gas supply source 66 into the gas diffusion space 40 through the gas supply line 64 and then the processing gas is discharged into the plasma generation space from the gas diffusion space 40 via the gas through holes 41 and the gas discharge holes 37, as in a shower device. That is, the upper electrode 34 functions as a shower head for supplying the processing gas.

A first high frequency power supply 48 is electrically connected with the upper electrode 34 via a matching unit 46 and a power feed rod 44. The first high frequency power supply 48 outputs a high frequency power of a relatively high frequency in the range from about 27 MHz to about 100 MHz (in the present embodiment, about 60 MHz). The first matching unit 46 matches a load impedance with an output impedance of the first high frequency power supply 48. When plasma is generated within the processing chamber 10, the first matching unit 46 makes the output impedance of the first high frequency power supply 48 and the load impedance apparently matched with each other. An output terminal of the first matching unit 46 is connected with an upper end of the power feed rod 44.

Besides the first high frequency power supply 48, a variable DC power supply 50 is also electrically connected with the upper electrode 34. The variable DC power supply may be a bipolar power supply. To elaborate, the variable DC power supply 50 is connected with the upper electrode 34 via the first matching unit 46 and the power feed rod 44, and a power feed from the variable DC power supply 50 can be turned on and off by an on/off switch 52. A polarity and a current·voltage of the variable DC power supply 50 and an on/off operation of the on/off switch 52 are controlled by a controller 51.

Figure 2:
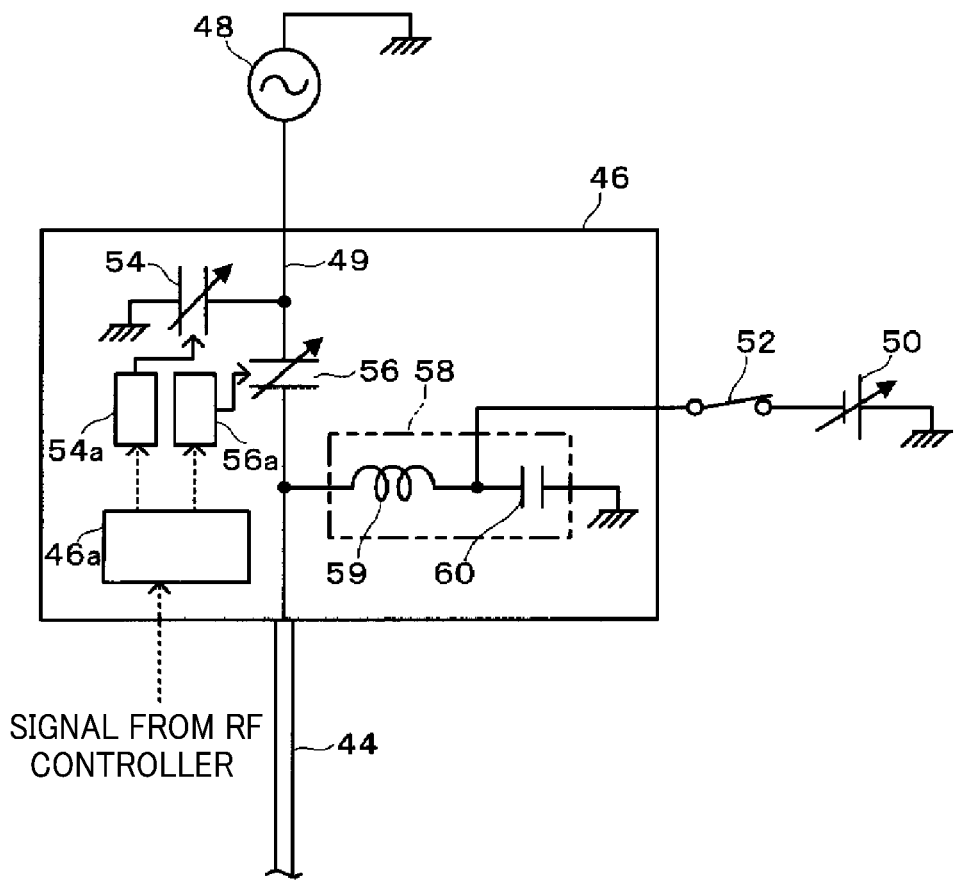
FIG. 2 is a configuration view of a first matching unit of the plasma etching apparatus of FIG. 1.

As illustrated in FIG. 2, the first matching unit 46 includes a first variable capacitor 54 branched from a branch point on a power feed line 49 of the first high frequency power supply 48, a second variable capacitor 56 provided downstream of the branch point of the power feed line 49. The first variable capacitor 54 is driven by a stepping motor 54*a* and the second variable capacitor 56 is driven by a stepping motor 56*a*, so that the above-described matching operation is performed. Further, the operations of the stepping motors 54*a* and 56*a* are controlled by a matching unit controller 46*a*, and a signal from a RF controller 95 is inputted to the matching unit controller 46*a* as will be described later.

Further, the first matching unit 46 includes therein a filter 58 that traps a high frequency power (e.g., about 60 MHz) from the first high frequency power supply 48 and a high frequency power (e.g., about 13.56 MHz) from a second high frequency power supply such that a DC voltage current (hereinafter, simply referred to as "DC voltage") can be efficiently applied to the upper electrode 34. That is, a DC current from the variable DC power supply 50 flows into the power feed line 49 through the filter 58. The filter 58 includes a coil 59 and a capacitor 60 which trap a high frequency power from the first high frequency power supply 48 and a high frequency power from the second high frequency power supply.

As illustrated in FIG. 1, there is installed a cylindrical ground conductor 10*a* which extends upwardly from a sidewall of the processing chamber 10 to be higher than the height of the upper electrode 34. A ceiling wall portion of the cylindrical ground conductor 10*a* is electrically insulated from the power feed rod 44 via a cylindrical insulating member 44*a*.

The susceptor 16 serving as a lower electrode is electrically connected with a second high frequency power supply 90 via a second matching unit 88. A high frequency power is supplied from the second high frequency power supply 90 to the susceptor 16 serving as a lower electrode, and, thus, a bias is applied to the semiconductor wafer W and ions are attracted to the semiconductor wafer W. The second high frequency power supply 90 outputs a high frequency power within a frequency range lower than that of the first high frequency power supply 48, e.g., about 400 kHz to about 13.56 MHz (in the present embodiment, about 13.56 MHz).

The second high frequency power supply 90 is connected with the RF controller 95 that controls the second high frequency power supply 90. The RF controller 95 is capable of performing a power control so as to allow the high frequency power from the second high frequency power supply 90 to be power-modulated periodically between a first power and a second power higher than the first power. Further, the RF controller 95 controls the second high frequency power supply 90 to be switchable between a typical continuous mode and a power control mode.

Figure 3:
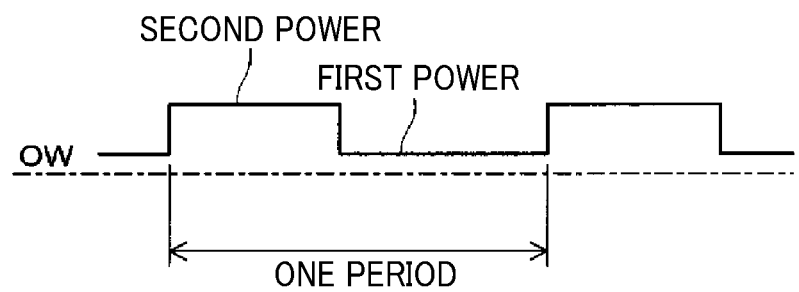
FIG. 3 is a diagram showing an example power modulation in the plasma processing apparatus of FIG. 1.
Figure 4:
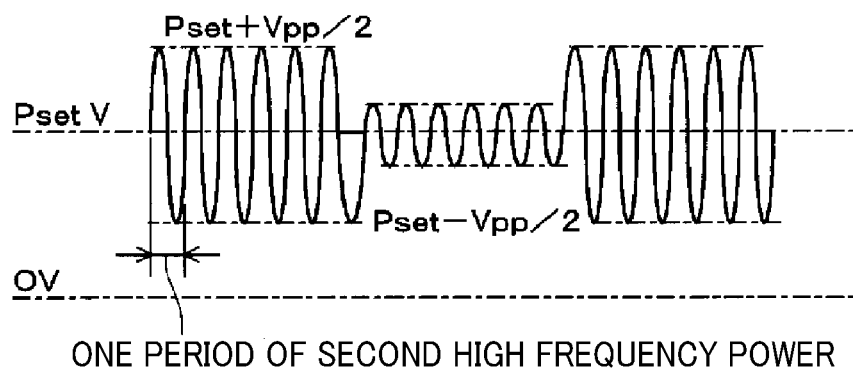
FIG. 4 is a diagram illustrating an example power modulation in the plasma processing apparatus of FIG. 1.

A pulse waveform as shown in FIG. 3, but not limited thereto, can be a typical example of a power modulation. Further, in the example shown in FIG. 3, a duty ratio of a pulse is about 50%. At this time, an output voltage waveform is as shown in FIG. 4. In FIG. 4, $V_{pp}$ denotes a difference between a maximum voltage value and a minimum voltage value in one period, and $P_{set}$ denotes a setting voltage.

The RF controller 95 is also connected with the second matching unit 88 to control the second matching unit 88. Further, the RF controller 95 is also connected with the first high frequency power supply 48 and the first matching unit 46, and, thus, the RF controller 95 controls both of them, too.

Figure 5:
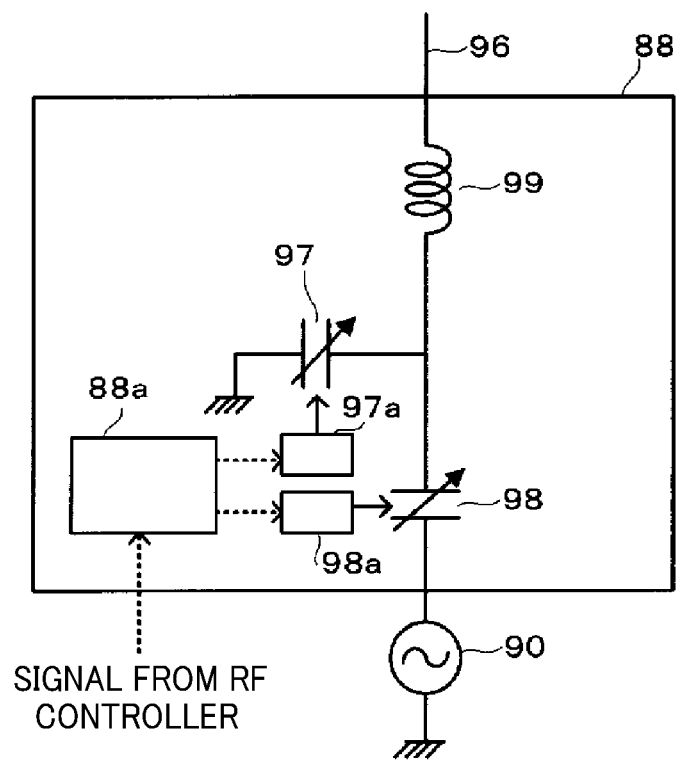
FIG. 5 is a configuration view showing a second matching unit of the plasma etching apparatus of FIG. 1.

The second matching unit 88 matches a load impedance with an output impedance of the second high frequency power supply 90. When plasma is generated within the processing chamber 10, the second matching unit 88 makes the output impedance of the second high frequency power supply 90 and the load impedance including the plasma within the processing chamber 10 apparently matched with each other. As illustrated in FIG. 5, the second matching unit 88 includes a first variable capacitor 97 branched from a branch point on a power feed line 96 of the second high frequency power supply 90, a second variable capacitor 98 provided between the branch point of the power feed line 96 and the second high frequency power supply 90, and a coil 99 provided opposite to the branch point. The first variable capacitor 97 is driven by a stepping motor 97*a* and the second variable capacitor 98 is driven by a stepping motor 98*a*, so that the above-described matching operation is performed. Further, the operations of the stepping motors 97*a* and 98*a* are controlled by a matching unit controller 88*a*, and a signal from a RF controller 95 is inputted to the matching unit controller 88*a* as will be described later.

In the present embodiment, unlike in a typical plasma etching process, the second high frequency power supply 90 is operated in a power modulation mode in which the high frequency power is power-modulated periodically. In the power modulation mode, the RF controller 95 controls the matching operation of the second matching unit 88 to be switched in synchronization with the power modulation. A control signal from the RF controller 95 is inputted to the matching unit controller 88*a* of the second matching unit 88, as illustrated in FIG. 5.

In this case, when the second high frequency power supply 90 is operated in the power modulation mode, the RF controller 95 controls the second matching unit 88 not to perform the matching operation during a first power application, and during a second power application, the RF controller 95 controls the second matching unit 88 not to perform the matching operation for a preset time after the second power application starts (mask control). After the lapse of the preset time, the RF controller 95 controls the second matching unit 88 to perform the matching operation so as to render the output impedance of the second high frequency power supply 90 and the load impedance including the plasma within the processing chamber 10 matched with each other.

Figure 6:
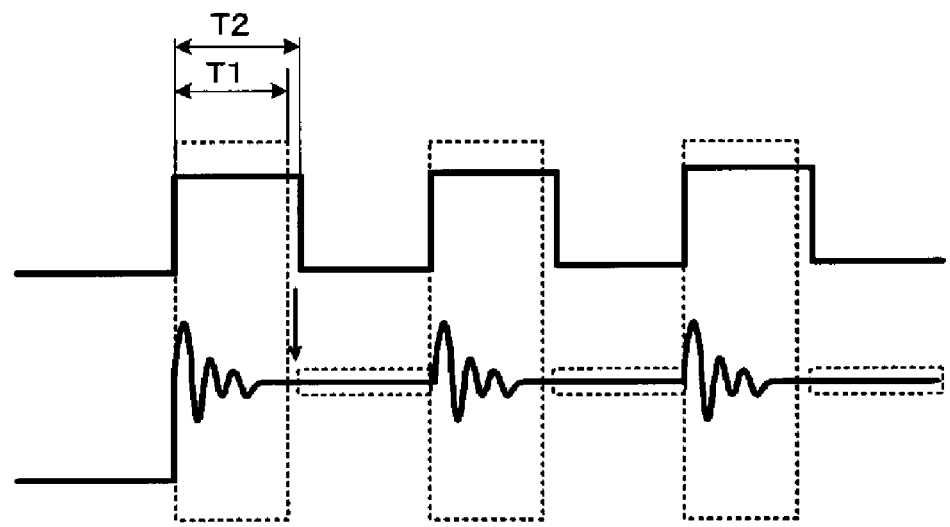
FIG. 6 is a diagram illustrating an operation of the second matching unit of the plasma etching apparatus of FIG. 1.

Specifically, as shown in FIG. 6, a capacitance C1 of the first variable capacitor 97 and a capacitance C2 of the second variable capacitor 98 are independently controlled only during the application of the second power having a relatively high power level and only after the lapse of the preset time (T1 in FIG. 6) from the start of the application of the second power (start of a pulse in FIG. 6). Meanwhile, the capacitance C1 and the capacitance C2 are maintained constant during the first power application and during the preset time (T1 in FIG. 6) after the second power application is started (start of the pulse in FIG. 6).

In the pulse modulation mode illustrated in FIG. 6, the power modulation is carried out in a pulse pattern and a duty ratio of the pulse is about 50%. A frequency is about 15 Hz, and a pulse period is about 66 milliseconds. Further, a single pulse width (T2 in FIG. 6) for the application of the second power is about 33 milliseconds. The matching operation of the second matching unit 88 can be set to be stopped within a range of about 0 to about 98.5% of the single pulse width (33 milliseconds) for the application of the second power after the start of the application of the second power (start of the pulse in FIG. 6). Further, the RF controller 95 sets the time (about 0 to about 98.5% of the pulse width) during which the matching operation of the second matching unit 88 is stopped (masked) after the start of the second power application. Based on the set time, the RF controller 95 controls the operation of the second matching unit 88.

Figures 7A, 7B:
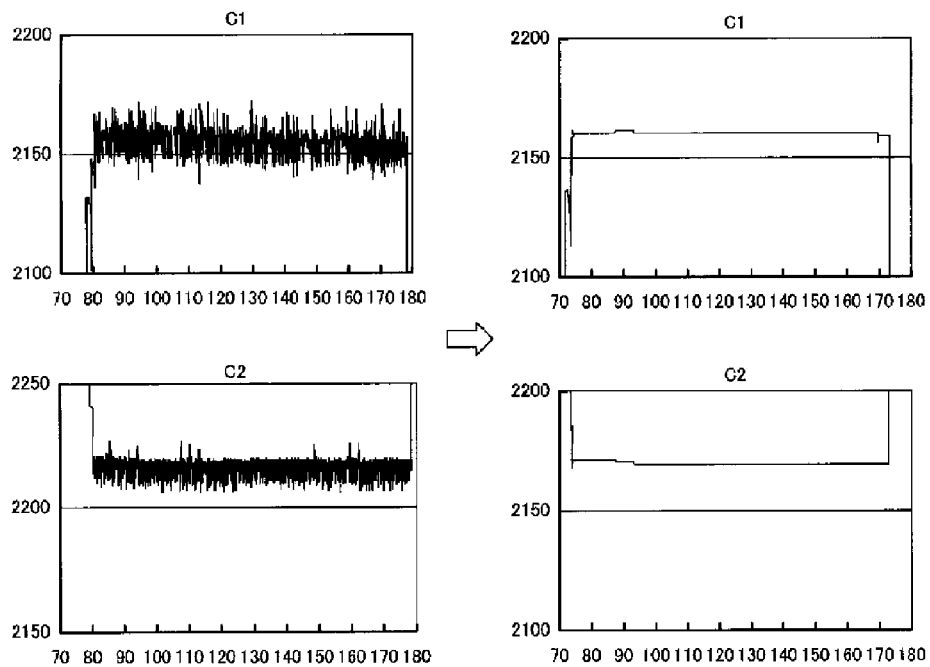
FIGS. 7A and 7B are diagrams for describing effects of the first embodiment of the preset disclosure.

A variation of the load impedance including the plasma within the processing chamber 10 is shown in a lower part of FIG. 6. The load impedance is fluctuated depending on a variation of a plasma state according to the start of the application of the relatively high second power and then gradually converged. If the matching operation of the second matching unit 88 is performed when the load impedance is fluctuated, minute operations of the first variable capacitor 97 (C1) and the second variable capacitor 98 (C2) are repeated, as shown in FIG. 7A. In FIGS. 7A and 7B, a vertical axis represents a step number of the stepping motors 97*a* and 98*a* for driving the first and second variable capacitors 97 and 98 respectively, and a horizontal axis indicates time.

When the operation as shown in FIG. 7A is performed in the second matching unit 88, plasma stabilization would be deteriorated and lifetime of the first and second variable capacitors 97 and 98 would be shortened. In contrast, in the present embodiment, since the capacitance C1 of the first variable capacitor 97 and the capacitance C2 of the second variable capacitor 98 are independently controlled only after the lapse of the preset time (T1 in FIG. 6) from the start of the application of the second power, the first variable capacitor 97 and the second variable capacitor 98 do not repeat minute operations, as shown in FIG. 7B, and, thus, they can be controlled successfully. Therefore, plasma stabilization can be achieved, and reduction of the lifetime of the first and second variable capacitors 97 and 98 can be avoided.

Further, parts surrounded by dotted lines in FIG. 6 indicate a time during which the matching operation of the second matching unit 88 is stopped, i.e., a mask control is performed. When the second power is applied, a time (T1 in FIG. 6) during which the matching operation of the second matching unit 88 is stopped varies depending on a difference between the first and second powers in the power modulation, a duty ratio and a frequency of the power modulation, or the like. Desirably, the stop time of the matching operation may be equal to or greater than about 50% of the time (pulse width) during which the second power is applied. Further, data shown in FIG. 7 were obtained by power-modulating the high frequency power (about 13.56 MHz) from the second high frequency power supply 90 at about 2000 W or about 150 W while fixing the high frequency power (about 60 MHz) from the first high frequency power supply 48 at about 150 W.

Furthermore, in the present embodiment, the second high frequency power supply 90 that applies the high frequency power to the lower electrode 16 is power-modulated, whereas the first high frequency power supply 48 that applies the high frequency power to the upper electrode 34 is operated in a continuous mode in which the high frequency power is applied at a constant power level without a power modulation. Desirably, the above-described mask control may be also performed for the high frequency power from the first high frequency power supply 48 in the continuous mode in the same manner as performed for the high frequency power from the second high frequency power supply 90.

Although the first high frequency power supply 48 outputs the high frequency power in the continuous mode, it is the fluctuated load impedance as shown in the lower part of FIG. 6 that the first matching unit 46 matches with the output impedance of the first high frequency power supply 48. It is because the load impedance including the plasma within the processing chamber 10 is common in any one of the first matching unit 46 and the second matching unit 88. Accordingly, it may be desirable to stop the matching operation of the first matching unit 46 during the same time and at the same timing as those for stopping the matching operation of the second matching unit 88. As a result, plasma stabilization can be certainly accomplished, and the lifetime of the first and second variable capacitors 54 and 56 in the first matching unit 46 can be lengthened.

During the above-discussed power modulation, since hunting takes place if only a forward power (Pf) is controlled as in a typical matching unit, it is desirable to use the second matching unit 88 having a function of controlling a load power (PL (=Pf−Pr)) in consideration of a reflection power (Pr). To elaborate, the second high frequency power supply 90 is controlled such that the power level (PL), which is supplied to the susceptor 16 serving as the lower electrode and is a difference between the power level Pf outputted from the second high frequency power supply 90 and the power level (Pr) reflected by the load impedance including the plasma within the processing chamber 10, is maintained constant. Likewise, since the first high frequency power supply 48 is affected by the power modulation of the high frequency power from the second high frequency power supply, a matching unit having a load power control function may be desirably used for the first high frequency power supply and the same control as stated above may be performed therefor.

The upper electrode 34 is electrically connected with a low pass filter (LPF) 92 which does not allow the high frequency power (about 60 MHz) from the first high frequency power supply 48 to pass therethrough but allows the high frequency power (about 13.56 MHz) from the second high frequency power supply 90 to pass through to the ground. The low pass filter (LPF) 92 may include an LR filter or an LC filter. Since it is possible to provide sufficient reactance to the high frequency power (about 60 MHz) from the first high frequency power supply 48 through only one conducting wire, no further installation is necessary. Meanwhile, a susceptor 16 serving as a lower electrode is electrically connected with a high pass filter (HPF) 94 that allows the high frequency power (about 60 MHz) from the first high frequency power supply 48 to pass through to the ground.

Installed at a bottom portion of the processing chamber 10 is an exhaust port 80, which is connected with a gas exhaust unit 84 via an exhaust line 82. The gas exhaust unit 84 is configured to depressurize the inside of the processing chamber 10 to a predetermined vacuum level with a vacuum pump such as a turbo-molecular pump. Further, provided at the sidewall of the processing chamber 10 is a loading/unloading port 85 for the semiconductor wafer W. The loading/unloading port 85 can be opened and closed by a gate valve 86.

Furthermore, detachably installed along an inner wall of the processing chamber 10 is a deposition shield 11 that prevents an etching byproduct (deposit) from being deposited onto the processing chamber 10. That is, the deposition shield 11 forms a processing chamber wall. The deposition shield 11 is also installed at an outer periphery of the inner wall member 26. At a bottom portion of the processing chamber 10, there is provided an exhaust plate 83 between the deposition shield 11 of the processing chamber wall and the deposition shield 11 of the inner wall member 26. The deposition shield 11 and the exhaust plate 83 can be made of an aluminum material coated with ceramic such as $Y_2O_3$.

A conductive member (GND block) 91, which is DC-connected to the ground, is provided on the deposition shield 11's processing chamber inner wall at the substantially same height as that of the wafer W. With this configuration, an abnormal electric discharge can be prevented, as will be discussed later. Further, the location of the conductive member 91 is not limited to the example shown in FIG. 1 as long as the conductive member 91 is located within a plasma generation region. For example, the conductive member 91 may be provided on the side of the susceptor 16, e.g., around the susceptor 16 and it may be also provided in the vicinity of the upper electrode 34. For instance, the conductive member 91 may be provided outside the upper electrode 34 in a ring shape.

Each component of the plasma etching apparatus, such as a power supply system, a gas supply system, a driving unit, or the RF controller 95, is configured to be connected with and controlled by a controller (overall control unit) 100. The controller 100 is connected with a user interface 101 including a keyboard through which a process manager inputs a command to manage the plasma processing apparatus and a display on which an operation status of the plasma processing apparatus is displayed.

Further, the controller 100 is connected with a storage unit 102 for storing therein: a control program by which the controller 100 controls various kinds of processes performed in the plasma etching apparatus; and a program, i.e., a processing recipe, which allows each component of the plasma etching apparatus to perform a process according to a processing condition. The recipe is stored in a storage medium of the storage unit 102. The storage medium may be a hard disc or a semiconductor memory, or may be a portable medium such as a CD-ROM, a DVD, and a flash memory. Alternatively, the recipe may be appropriately received from an external apparatus through a dedicated line.

If necessary, a required recipe is retrieved from the storage unit 102 and executed by the controller 100 in response to an instruction from the user interface 101, whereby a predetermined process is performed in the plasma etching apparatus under the control of the controller 100. The plasma etching apparatus described in the embodiments of the present disclosure may include this controller 100.

When an etching process is performed by the plasma etching apparatus having the above-described configuration, the gate valve 86 is opened, and the semiconductor wafer W as an etching target is loaded into the chamber 10 through the loading/unloading port 85 and mounted on the susceptor 16. Then, the processing gas for etching is supplied from the processing gas supply source 66 into the gas diffusion space 40 at a predetermined flow rate and then introduced into the chamber 10 through the gas through holes 41 and the gas discharge holes 37. At the same time, the inside of the processing chamber 10 is evacuated by the gas exhaust unit 84 so as to set a internal pressure of the chamber 10 to be in the range of, e.g., about 0.1 Pa to about 150 Pa.

In this case, conventional gases as a processing gas may be used. For example, a halogen-containing gas, typically, a fluorocarbon gas (CxFy) such as $C_4F_8$ can be used. Further, the processing gas may include another gas such as an Ar gas or an $O_2$ gas.

After the etching gas is introduced in the processing chamber 10 as described above, a high frequency power for plasma generation is applied from the first high frequency power supply 48 to the upper electrode 34, and a high frequency power for ion attraction is applied from the second high frequency power supply 90 to the susceptor 16. Further, a preset DC voltage is applied from the variable DC power supply 50 to the upper electrode 34. Further, a DC voltage is applied from the DC power supply 22 to the electrode 20 of the electrostatic chuck 18, whereby the semiconductor wafer W is held on the electrostatic chuck 18.

The processing gas discharged from the gas discharge holes 37 formed in the electrode plate 36 of the upper electrode 34 is excited into plasma during a glow discharge generated by a high frequency power between the upper electrode 34 and the susceptor 16 serving as a lower electrode. By radicals or ions generated in the plasma, a target surface of the semiconductor wafer W is etched.

In the present embodiment, when the plasma is generated, since a high frequency power for plasma generation having a high frequency of about 27 MHz or higher is supplied to the upper electrode 34, it is possible to increase density of plasma in a desired state, and, thus, even under the lower pressure condition, high-density plasma can be generated.

Further, when the plasma is generated, a polarity and a magnitude of the DC voltage applied to the upper electrode 34 from the variable DC power supply 50 is controlled by the controller 51. Accordingly, a self-bias voltage $V_{dc}$ on the surface of the upper electrode 34 as an application electrode can be increased, i.e., an absolute value of the $V_{dc}$ on the surface of the upper electrode 34 can be increased so as to obtain a preset (appropriate) sputtering effect on the surface of the upper electrode 34, i.e., on the surface of the electrode plate 36.

When the high frequency power applied from the first high frequency power supply 48 is low, polymer would be deposited on the upper electrode 34. By applying an appropriate DC voltage from the variable DC power supply 50, however, the polymer deposited on the upper electrode 34 can be sputtered, and, thus, the surface of the upper electrode 34 can be cleaned and an optimal amount of polymer can be supplied onto the semiconductor wafer W. Accordingly, surface roughness of a photoresist film can be solved, and an etching selectivity between the photoresist film and an underlying film can be increased. Moreover, instead of controlling the application voltage from the variable DC power supply 50, an application current or an application power can be controlled.

As discussed above, by applying a DC voltage to the upper electrode 34, various effects can be achieved, and, especially, selectivity between an etching target film and an underlying etching stopper film can be increased due to the effect of appropriately supplying polymer to the semiconductor wafer W which is a processing target object. However, when a SiOC-based Low-k film, which is an etching target film as an upper layer, is etched while using a SiC film, which is a Low-k barrier film, as the underlying etching stopper film, a margin for achieving sufficient etching selectivity is very narrow even if the DC voltage is applied because the compositions of the two films are very similar.

If the plasma is generated within the processing chamber 10, polymer is supplied from the upper electrode 34 to the semiconductor wafer W. Thus, polymer would be deposited on the semiconductor wafer if a bias is not applied, whereas etching would progress if an absolute value of the self-bias voltage $V_{dc}$ is increased. At this time, in order to etch the SiOC-based Low-k film with high density, a $V_{dc}$ allowing etching of the SiOC-based Low-k film while preventing etching of the underlying SiC film is required. Since, however, the SiCO-based Low-k film and the SiC film have very similar compositions, their etching characteristics are also similar. For the reason, the margin for carrying out high-selectivity etching is very narrow in a typical etching process, and, thus, an etching rate cannot be increased.

An etching process progresses by way of attracting ions to an etching target film by applying a bias thereto. However, since polymer is supplied to and deposited on the etching target film as mentioned above, the $V_{dc}$ (ion energy incident on the wafer) needs to be selected such that an ion penetration depth is larger than a polymer thickness in order to progress the etching process. Meanwhile, after the etching target film is etched, etching of the underlying film would be stopped if the thickness of the polymer deposited on the underlying film is larger than the ion penetration depth, thus enabling high-selectivity etching. However, in case that the etching characteristics of the etching target film and the underlying film are similar, if overetching is consecutively performed after the etching target film is etched with a high etching rate, the underlying film would be etched because the polymer thickness on the underlying film is thinner than the ion penetration depth at a time point when the etching target film has been completely removed.

Thus, in the present embodiment, power modulation is periodically performed between a first power at which polymer is deposited on the etching target film and a second power at which the etching target film of the processing target substrate is etched so as to allow the polymer thickness to be thicker than the ion penetration depth at the time point when the etching target film is completely removed, i.e., when overetching is started after the etching target film is etched. At this time, the RF controller 95 switches the second high frequency power supply 90 from a typical operation mode to a power modulation mode in response to an instruction from the control unit 100. Accordingly, by depositing the polymer at the first power and progressing the etching at the second power, a polymer layer thicker than the ion penetration depth can be formed when the overetching is begun. As a result, the etching can be stopped without greatly removing the etching stopper film.

In the present example, a typical example of a waveform for power-modulating the high frequency power from the second high frequency power supply 90 may be of a pulse pattern as discussed above. However, the waveform pattern is not limited thereto, but another waveform such as a sine curve or the like is also possible as long as the high frequency power is modulated between the first power and the second power.

Desirably, in the power modulation, the first power of a lower level is larger than 0. Deposits of polymer can be more effectively supplied when the power is set to be a certain power level larger than 0. The first power and the second power may be appropriately set depending on other etching conditions, film conditions, or the like. Desirably, the first power may be in the range of about 10 W to about 500 W, and the second power may be in the range of about 100 W to about 5000 W. More desirably, the second power may be in the range of about 100 W to 1000 W.

Further, a frequency of the power modulation may be desirably about 0.25 Hz to about 100 Hz. In this range, generation of the polymer layer can be appropriately carried out. That is, when a duty ratio of the power modulation (pulse) is 50%, a first power duration in which polymer is deposited would become less than about 10 milliseconds in one period if a frequency exceeds about 100 Hz, rendering it difficult to form a sufficient amount of deposits. If a frequency is less than about 0.25 Hz, on the other hand, the duration of the first power per a period may exceed 2 seconds, resulting in an excessively thick polymer layer.

Although the typical duty ratio (second power time/one period time) of a power modulation (pulse) may be 50%, the duty ratio can be appropriately adjusted in the range of about 1% to about 99% depending on etching conditions, conditions of an etching target film and a underlying film, or the like.

As for the etching, the etching target film is first etched with the high etching rate in the typical operation mode in which a bias power is not modulated, and the above-mentioned power modulation mode is then performed to switch the bias power prior to the completion of the etching of the etching target film. Such a switchover to the power modulation mode needs to be performed at timing when the underlying film is exposed while the etching target film is etched so as to form an appropriate amount of polymer layer. If the switchover to the power modulation mode is performed immediately before the overetching is started, the thickness of the polymer layer may become insufficient in the overetching. In contrast, if the switchover is carried out too early, the etching rate would be reduced. Accordingly, when the underlying film is exposed, it may be desirable that the switchover be performed at timing as close to the start of the overetching as possible so as to secure time for allowing the formation of the appropriate amount of polymer layer. Desirably, the switchover may be performed at a time point when a remaining thickness of the etching target film is in the range of about 20 nm to about 30 nm, although it may differ depending on etching conditions or the like.

When the etching is performed in such a power modulation mode, the sufficient polymer layer can be formed because the above-described polymer supplying effect is obtained by applying the DC voltage from the variable DC power supply 50 to the upper electrode 34. However, if the DC voltage is not applied, the bias power is modulated, and, thus, a reflection wave of the high frequency power for plasma generation applied to the upper electrode 34 from the first high frequency power supply 48 would be increased, raising a concern that plasma would become unstable. Therefore, by applying the DC voltage to the upper electrode 34 from the variable DC power supply 50, a thickness of a plasma sheath formed on the side of the upper electrode 34 is fixed, and, thus, the reflection wave of the high frequency power for plasma generation applied to the upper electrode 34 is reduced. Thus, plasma can be stabilized. Accordingly, process stability and/or lifetime of the first high frequency power supply 48 can be improved, and in this regard, the application of the DC voltage is advantageous.

Although the DC voltage applied to the upper electrode 34 may be appropriately set depending on the etching conditions, the DC voltage may be desirably in the range of about −300 kV to about −2 kV in both of the typical continuous mode and the power modulation mode.

Now, an example of setting the first high frequency power supply 48 as well as the second high frequency power supply 90 in the power modulation mode will be explained. In consideration of plasma stability or the like, it may be also desirable to set the first high frequency power supply 48 in the power modulation mode when the second high frequency power supply 90 is set in the power modulation mode. At this time, the RF controller 95 controls the first high frequency power supply 48 as well as the second high frequency power supply to perform the power modulation.

To elaborate, in synchronization with the power modulation mode of the second high frequency power supply 90, the first high frequency power supply 48 is power-modulated between a third power and a fourth power which is higher than the third power. In this case, the high and low powers of the first high frequency power supply 48 may be switched at the same or reverse timing as the high and low powers of the second high frequency power supply 90. In any case, it is desirable to stop the matching operation of the first matching unit 46 for the first high frequency power supply 48 during the third power application and for a preset time after the fourth power application (high power) is started, as in the power modulation mode of the high frequency power from the second high frequency power supply 90.

Furthermore, the second high frequency power supply 90 can be operated in a typical continuous mode, while the first high frequency power supply 48 is operated in the power modulation mode. In such a case, the above-described mask control may be performed for the high frequency power from the first high frequency power supply 48, desirably. That is, the matching operation of the first matching unit 46 is stopped for the third power application time and for the preset time after the fourth power application (high power) is started.

Further, the mask control may also be desirably performed for the high frequency power from the second high frequency power supply 90 in the continuous mode in the same manner as performed for the high frequency power from the first high frequency power supply 48. That is, the matching operation of the second matching unit 88 is stopped for the same time and at the same timing as those for stopping the matching operation of the first matching unit 46.

Figure 8:
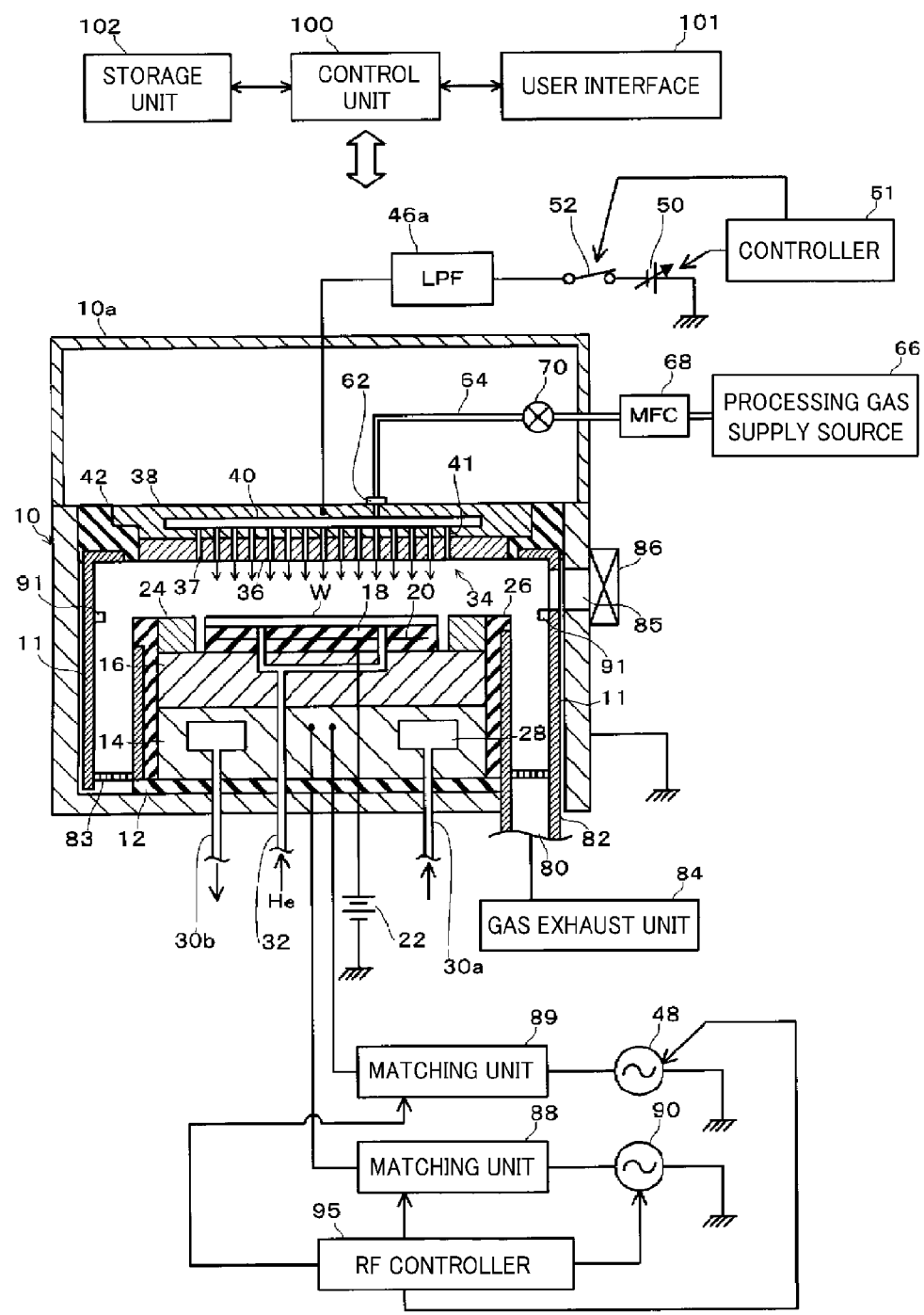
FIG. 8 is a longitudinal cross sectional view showing a configuration of a plasma etching apparatus in accordance with a second embodiment of the present disclosure.

Now, a second embodiment of the present disclosure will be explained. FIG. 8 illustrates a cross sectional configuration of a plasma etching apparatus in accordance with the second embodiment of the present disclosure.

This plasma etching apparatus is different from the plasma etching apparatus in the first embodiment shown in FIG. 1 in that a high frequency power for plasma generation from a first high frequency power supply 48 is applied to a susceptor 16 serving as a lower electrode. Other configurations are basically the same as those of the plasma etching apparatus shown in FIG. 1. Thus, same reference numerals will be assigned to parts corresponding to those of FIG. 1, and redundant description will be omitted.

In the second embodiment, the first high frequency power supply 48 for generating plasma and a second high frequency power supply 90 for applying a bias for ion attraction are both connected with the susceptor 16 serving as the lower electrode. The first high frequency power supply 48 is connected with the susceptor 16 via a first matching unit 89. The first matching unit 89 has the same configuration as that of a second matching unit 88, and the first matching unit 89 functions to render an output impedance of the first high frequency power supply 48 and a load impedance apparently matched with each other when plasma is generated within a processing chamber 10. As in the first embodiment illustrated in FIG. 1, a frequency of the first high frequency power supply 48 is desirably in the range of about 27 MHz to about 100 MHz.

As described above, the second high frequency power supply 90 is configured to apply a high frequency power in a power modulation mode under the control of a RF controller 95. As in the above-described first embodiment, in the power modulation mode, the second matching unit 88 is controlled not to perform a matching operation at a first power and not to perform the matching operation at a second power for a preset time after the start of the second power application. After a lapse of the preset time, the matching operation of the second matching unit 88 is performed. Moreover, as described in the first embodiment, the first high frequency power supply 48 is also capable of applying the high frequency power in a power modulation mode under the control of the RF controller 95. In this power modulation mode, the same control as that for the second matching unit 88 is performed for the first matching unit 89 as well.

Furthermore, as in the above-stated embodiment, the mask control may also be desirably performed for the high frequency power from the first high frequency power supply 48 in the continuous mode in the same manner as performed for the high frequency power from the second high frequency power supply 90 in the power modulation mode. A matching operation of the first matching unit 89 is stopped for the same period and at the same timing as those for stopping the matching operation of the second matching unit 88.

Meanwhile, no high frequency power supply is connected to an upper electrode 34, and a variable DC power supply 50 is connected with the upper electrode 34 via a low pass filter (LPF) 46a. The low pass filter (LPF) 46a functions to trap the high frequency component from the first and second high frequency power supplies, and may include an LR filter or an LC filter.

The second embodiment is implemented by a plasma etching apparatus of a lower-electrode dual-frequency application type that applies a first high frequency (RF) power for plasma generation and a second high frequency (RF) power for ion attraction to the susceptor 16 serving as the lower electrode. Advantages of this type plasma etching apparatus over the other types of capacitively coupled plasma etching apparatuses are briefly mentioned as follows.

First, the plasma can be generated closer to the wafer W and the plasma is not diffused widely by applying the high frequency power for plasma generation to the susceptor 16 serving as the lower electrode, and, thus, dissociation of the processing gas can be suppressed. Accordingly, even under condition that the internal pressure of the processing chamber 10 is high and the plasma density is low, it is possible to increase an etching rate of the semiconductor wafer W. Further, even in case that the high frequency power for plasma generation has a high frequency, it is possible to obtain a relatively high ion energy with high efficiency.

Further, unlike an apparatus configured to apply a single high frequency power to the lower electrode, a plasma generating function and an ion attracting function, both of which are necessary for plasma etching, can be controlled independently. Accordingly, an etching requirement for high microprocessing can be satisfied.

In accordance with the second embodiment, in the plasma etching apparatus of the dual-frequency application type having the above-discussed functions, a DC voltage is applied to the upper electrode, thereby displaying the above-described functions. Thus, higher level of etching performance suitable for recent microprocessing is enabled. Further, by performing a power modulation of a high frequency bias power, an etching target film can be etched with a high selectivity and a high etching rate even in case that the etching target film and an underlying film has similar compositions as in a combination of, e.g., a SiOC-based Low-k film and a SiC film.

Furthermore, the second high frequency power supply 90 can be operated in the continuous mode, while the first high frequency power supply 48 is operated in the power modulation mode. In such a case, the above-described mask control may be performed for the high frequency power from the first high frequency power supply 48, desirably, as in the above-described embodiment. That is, the matching operation of the first matching unit 46 is stopped for the third power application time and for the preset time after the fourth power application (high power) is started.

Moreover, the mask control may also be desirably performed for the high frequency power from the second high frequency power supply 90 in the continuous mode in the same manner as performed for the high frequency power from the first high frequency power supply 48, as in the above-described embodiment. That is, the matching operation of the second matching unit 88 is stopped for the same time and at the same timing as those for stopping the matching operation of the first matching unit 89.

The above description of the embodiments of the present invention is provided for the purpose of illustration without limiting the present invention, and it would be understood by those skilled in the art that various changes and modifications may be made. For example, the embodiments have been described for the case of applying a DC voltage to the upper electrode, application of the DC voltage is optional.

What is claimed is:

1. A plasma processing method using a plasma processing apparatus that includes a processing chamber configured to accommodate a substrate and perform a plasma process thereon; a processing gas supply unit configured to supply a processing gas into the processing chamber; a pair of parallel-plate electrodes provided within the processing chamber, the pair of parallel-plate electrodes including a lower electrode serving as a mounting table and an upper electrode provided above the lower electrode; an ion attraction power supply connected with the lower electrode and configured to apply a power for attracting ions to the lower electrode; a plasma generation power supply connected with the lower electrode or the upper electrode and configured to apply a power for generating plasma to the lower electrode or the upper electrode; an ion attraction matching unit configured to perform impedance matching of the power for attracting ions, the ion attraction matching unit being connected to the lower electrode; and a plasma generation matching unit configured to perform impedance matching of the power for generating plasma, the plasma generation matching unit being connected to the lower electrode or the upper electrode, the method comprising:

controlling the plasma generation power supply to be operated in a continuous mode in which the power for generating plasma is applied at a constant power level;

performing a power modulation that periodically switches the power for attracting ions between a first power and a second power higher than the first power;

performing a mask control that stops a matching operation of the ion attraction matching unit for an application time of the first power and for a preset time after an application of the second power is started; and stopping the matching operations of the plasma generation matching unit and the ion attraction matching unit simultaneously for the preset time.

2. The plasma processing method of claim 1, wherein the power modulation is performed after the plasma process is performed on the substrate for a preset time by applying a power of a preset power level from the ion attraction power supply.

3. The plasma processing method of claim 1, wherein the preset time of performing the mask control is equal to or greater than 50% of a time during which the second power is applied.

4. The plasma processing method of claim 1, wherein the preset time is set to be equal to or longer than a period of time for which a load impedance including a plasma within the processing chamber is fluctuated according to the application of the second power.

5. A plasma processing method using a plasma processing apparatus that includes a processing chamber configured to accommodate a substrate and perform a plasma process thereon; a processing gas supply unit configured to supply a processing gas into the processing chamber; a pair of parallel-plate electrodes provided within the processing chamber, the pair of parallel-plate electrodes including a lower electrode serving as a mounting table and an upper electrode provided above the lower electrode; an ion attraction power supply connected with the lower electrode and configured to apply a power for attracting ions to the lower electrode; a plasma generation power supply connected with the lower electrode or the upper electrode and configured to apply a power for generating plasma to the lower electrode or the upper electrode; and an ion attraction matching unit configured to perform impedance matching of the power for attracting ions, the ion attraction matching unit being connected to the lower electrode; and a plasma generation matching unit configured to perform impedance matching of the power for generating plasma, the plasma generation matching unit being connected to the lower electrode or the upper electrode, the method comprising:

controlling the ion attraction power supply to be operated in a continuous mode in which the power for attracting ions is applied at a constant power level;

performing a power modulation that periodically switches the power for generating plasma between a first power and a second power higher than the first power;

performing a mask control that stops a matching operation of the plasma generation matching unit for an application time of the first power and for a preset time after an application of the second power is started; and stopping the matching operations of the plasma generation matching unit and the ion attraction matching unit simultaneously for the preset time.

6. The plasma processing method of claim 5, wherein the power modulation is performed after the plasma process is performed on the substrate for a preset time by applying a power of a preset power level from the plasma generation power supply.

7. The plasma processing method of claim 5, wherein the preset time of performing the mask control is equal to or greater than 50% of a time during which the second power is applied.

8. The plasma processing method of claim 5, wherein the preset time is set to be equal to or longer than a period of time for which a load impedance including a plasma within the processing chamber is fluctuated according to the application of the second power.

* * * * *

UNITED STATES PATENT AND TRADEMARK OFFICE
CERTIFICATE OF CORRECTION

PATENT NO. : 9,455,153 B2
APPLICATION NO. : 13/920303
DATED : September 27, 2016
INVENTOR(S) : Genki Koguchi et al.

It is certified that error appears in the above-identified patent and that said Letters Patent is hereby corrected as shown below:

In the Specification

Column 5, Line 9, insert -- 38 -- after the word "support".

Signed and Sealed this
Thirty-first Day of January, 2017

Michelle K. Lee
*Director of the United States Patent and Trademark Office*